US00RE36663E

United States Patent [19]

Smith et al.

[11] E Patent Number: Re. 36,663

[45] **Reissued Date of Patent: *Apr. 18, 2000**

[54] PLANARIZED SELECTIVE TUNGSTEN METALLIZATION SYSTEM

[75] Inventors: Gregory C. Smith; Thomas D. Bonifield, both of Dallas, Tex.

[73] Assignee: Texas Instruments Incorporated

[ * ] Notice: This patent issued on a continued prosecution application filed under 37 CFR 1.53(d), and is subject to the twenty year patent term provisions of 35 U.S.C. 154(a)(2).

[21] Appl. No.: 08/473,812

[22] Filed: Jun. 7, 1995

Related U.S. Patent Documents

Reissue of:

[64] Patent No.: 5,055,423
Issued: Oct. 8, 1991
Appl. No.: 07/383,304
Filed: Jul. 18, 1989

U.S. Applications:

[ 63] Continuation of application No. 08/134,151, Oct. 8, 1993, abandoned, which is a continuation of application No. 07/138,239, Dec. 28, 1987, abandoned.

[51] Int. Cl.[7] ..... H01L 21/00; H01L 21/02; H01L 21/90; H01L 21/283

[52] U.S. Cl. ..... 438/622; 438/637; 438/641; 438/674; 438/677

[58] Field of Search ..... 437/187, 189, 437/192, 195; 438/622, 637, 641, 674, 677

[56] References Cited

U.S. PATENT DOCUMENTS

| | | | |
|---|---|---|---|
| 3,597,834 | 8/1971 | Lathrop et al. | 29/567 R |
| 3,714,521 | 1/1973 | Shaw | 317/234 R |
| 3,737,340 | 6/1973 | Maeda et al. | 117/212 |

(List continued on next page.)

FOREIGN PATENT DOCUMENTS

| | | | |
|---|---|---|---|
| 0168828 | 7/1985 | European Pat. Off. | H01L 23/48 |
| 3414781 | 4/1984 | Germany | H01L 23/52 |
| 3625860 | 7/1986 | Germany | H01L 21/90 |

(List continued on next page.)

OTHER PUBLICATIONS

T. I. Kamins, P. J. Marcoux, J. L. Moll, and L. M. Roylance, "Patterned Implanted Buried–Oxide Transistor Structures", Hewlett–Packard Laboratories, Jan. 31, 1986, pp. 423–426.

T. D. Bonifield, R. J. Gale, B. W. Shen, G. C. Smith, and C. H. Huffman, "A One Micron Design Rule Double Level Metallization Process", Texas Instruments Incorporated, Jun. 9–10, 1986, pp. 71–77.

J.G. Black, S. P. Doran, M. Rothschild, J. H. C. Sedlacek, and D. J. Ehrlich, "GaAs Circuit Restructuring by Multi–Level Laser–Direct–Written Tungsten Process", Massachusetts Institute of Technology, 1987, pp. 651–655.

D. Bursky, "Process Advancements Fuel IC Developments", Electronic Design, Jan. 9, 1992.

(List continued on next page.)

*Primary Examiner*—Chandra Chaudhari
*Assistant Examiner*—Matthew Whipple
*Attorney, Agent, or Firm*—Rebecca Mapstone Lake; Richard L. Donaldson

[57] ABSTRACT

In an improved selection tungsten metallization system, a plurality of orifices (20) are cut into a first level dielectric layer (18). A nucleation layer (52), preferably Ti-W alloy, is then formed in each orifice (20) and on the outer surface of the first dielectric layer (18) in a second-level metallization pattern. A second dielectric layer (30) is deposited over the first dielectric layer (18) and the nucleation layer (52), and a reverse second level metallization pattern is used to etch slots (58) back down to the nucleation layers (52) and into orifices (20). Thereafter, tungsten is deposited by selective CVD to fill the first level orifices (20) and the second level slots (58) until the upper surfaces (62) of the tungsten conductors (60) are substantially coplanar with the upper surface (38) of the second dielectric layer (30).

26 Claims, 4 Drawing Sheets

FOREIGN PATENT DOCUMENTS

| | | | |
|---|---|---|---|
| 57-132341 | 8/1982 | Japan | H01L 21/88 |
| 59-050544 | 3/1984 | Japan | H01L 21/88 |
| 60-035536 | 2/1985 | Japan | H01L 21/88 |
| 60-117719 | 6/1985 | Japan | H01L 21/28 |
| 61-112356 | 8/1985 | Japan | H01L 21/88 |
| 61-222225 | 2/1986 | Japan | H01L 21/28 |
| 0199649 | 9/1986 | Japan | 437/195 |
| 64-41240 | 8/1987 | Japan | H01L 21/88 |
| 62-243324 | 10/1987 | Japan | H01L 21/88 |
| 2143372 | 2/1985 | United Kingdom | H01L 21/28 |

U.S. PATENT DOCUMENTS

| | | | |
|---|---|---|---|
| 3,751,292 | 8/1973 | Kongable | 117/212 |
| 3,798,135 | 3/1974 | Bracken et al. | 204/15 |
| 4,283,439 | 8/1981 | Higashinakagawa et al. | 427/89 |
| 4,410,622 | 10/1983 | Dalal et al. | 437/192 |
| 4,517,225 | 5/1985 | Broadbent | 427/89 |
| 4,576,900 | 3/1986 | Chiang | 430/313 |
| 4,582,563 | 4/1986 | Hazuki et al. | 437/192 |
| 4,594,606 | 6/1986 | Goto et al. | 357/68 |
| 4,617,193 | 10/1986 | Wu | 427/38 |
| 4,624,864 | 11/1986 | Hartmann | 427/89 |
| 4,630,357 | 12/1986 | Rogers et al. | 29/590 |
| 4,640,738 | 2/1987 | Fredericks et al. | 156/656 |
| 4,654,113 | 3/1987 | Tuchiya et al. | 156/643 |
| 4,670,091 | 6/1987 | Thomas et al. | 156/643 |
| 4,670,967 | 6/1987 | Hazuki | 29/576 B |
| 4,710,398 | 12/1987 | Homma et al. | 437/235 |
| 4,721,689 | 1/1988 | Chaloux, Jr. et al. | 437/189 |
| 4,743,568 | 5/1988 | Wood | 437/189 |
| 4,746,621 | 5/1988 | Thomas | 437/24 |
| 4,764,484 | 8/1988 | Mo | 437/203 |
| 4,806,201 | 2/1989 | Mitchell et al. | 156/653 |
| 4,866,009 | 9/1989 | Matsuda | 437/203 |
| 4,868,068 | 9/1989 | Yamaguchi et al. | 428/596 |
| 4,900,695 | 2/1990 | Takahashi et al. | 437/195 |
| 4,931,410 | 6/1990 | Tokunaga et al. | 437/189 |
| 4,933,297 | 6/1990 | Lu | 437/41 |
| 4,937,657 | 6/1990 | DeBlasi et al. | 357/71 |
| 4,948,755 | 8/1990 | Mo | 437/195 |
| 4,962,058 | 10/1990 | Cronin et al. | 437/187 |
| 4,963,512 | 10/1990 | Iwanaga et al. | 437/192 |
| 5,043,290 | 8/1991 | Nishoika et al. | 437/24 |
| 5,069,749 | 12/1991 | Gutierrez | 156/646 |
| 5,071,789 | 12/1991 | Nakata | 437/192 |
| 5,084,414 | 1/1992 | Manley et al. | 437/189 |
| 5,169,680 | 12/1992 | Ting et al. | 427/96 |
| 5,580,615 | 12/1996 | Itoh et al. | 427/552 |

OTHER PUBLICATIONS

R. J. Mattox, S. R. Wilson, and J. A. Sellers, "Submicron Two–Layer Metal System of Selective Tungsten and TiW Cap Metallization", Motorola Semiconductor Products Sector, Bipolar Technology Center, Aug. 29, 1989, pp. 1484–1490.

E. K. Broadbent, "Nucleation and Growth of Chemically Vapor Deposited Tungsten on Various Substrate Materials: A Review", Signetics Corporation, May 11, 1987, pp. 1661–1666.

D. M. Brown, B. Gorowitz, P. A. Piacente, R. J. Saia, R. H. Wilson, and D. W. Woodruff, "Selective CVD Tungsten Via Plugs for Multilevel Metallization", General Electric Corporate Research and Development Center, IEDM 86, pp. 66–69.

K. C. Saraswat, S. Swirhun, and J. P. McVittie, "Selective CVD of Tungsten for VLSI Technology", Department of Electrical Engineering, Stanford University, pp. 409–419.

W. A. Metz, N. J. Szluk, G. W. Miller, and H. O. Hayworth, "Effect of Selective Tungsten as a Polysilicon Shunt on CMOS Ring–Oscillator Performance", IEEE Electron Device Letters, vol. EDL–6, No. 7, Jul. 1985, pp. 372–374.

D. Brown, B. Gorowitz, R. Wilson, D. Stoll and R. Saia, "Unframed Contacts Using Refractory Metals", IEEE Electron Device Letters, vol. EDL–6, No. 8, Aug. 1985, pp. 408–409.

T. Moriya, et al., "A Planar Metallization Process—Its Application to Tri–Level Aluminum Interconnection," *IEEE–IEDM 83*, 1983, pp. 550–553.

Gregory C. Smith, et al., "Comparison of Two Contact Plug Techniques for Use with Planarized Oxide," IEEE–V–MIC Conf., Jun. 9–10, 1986, pp. 403–410.

Wolf, Stanley *Silicon Processing for the VLSI ERT*, vol. 1, (1986) pp. 400–403.

Wolf, Stanley *Silicon Processing for the VLSI ERT*, vol. 2 (1990) pp. 251–252.

FIG. 2a
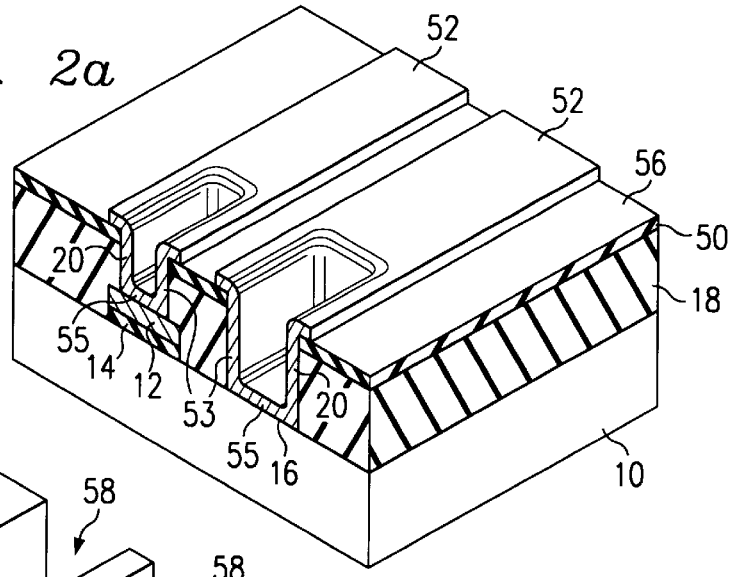
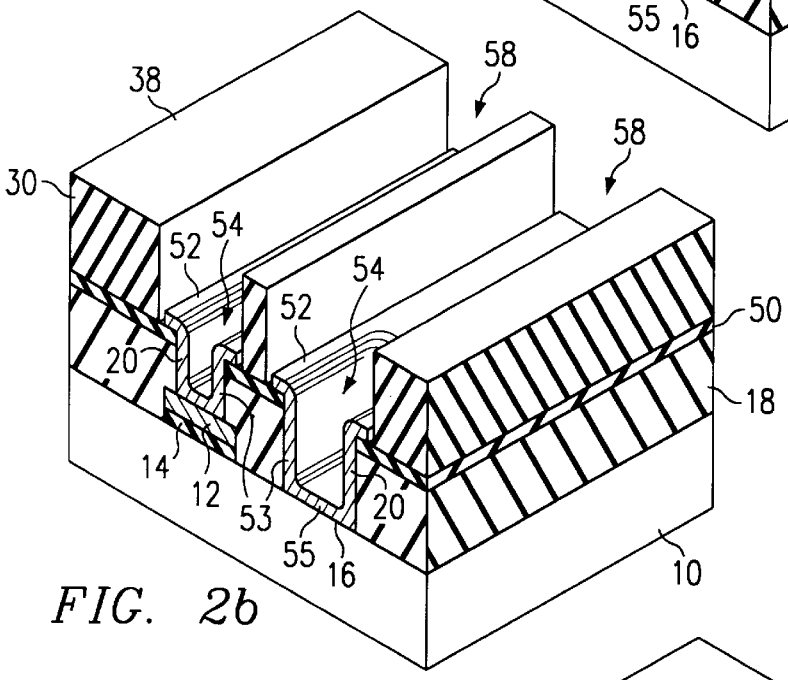
FIG. 2b
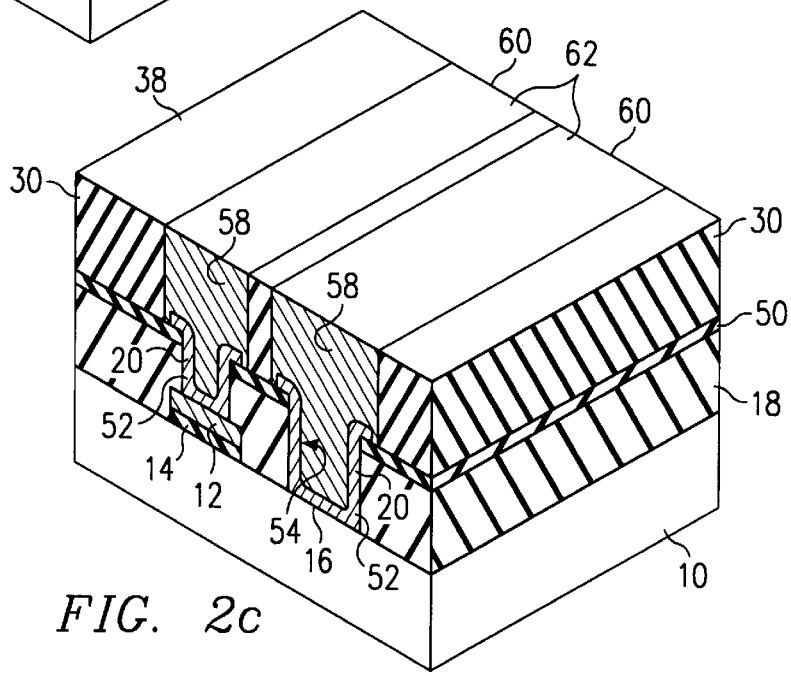
FIG. 2c

PLANARIZED SELECTIVE TUNGSTEN METALLIZATION SYSTEM

Matter enclosed in heavy brackets [ ] appears in the original patent but forms no part of this reissue specification; matter printed in italics indicates the additions made by reissue.

This application is a continuation of application *Ser. No. 08/134,151, filed Oct. 8, 1993, now abandoned, which is a reissue of Ser. No. 07/383,304, filed Jul. 18, 1989, now U.S. Pat. No. 5,055,423, which is a continuation of* Ser. No. 07/138,239, filed Dec. 28, 1987, now abandoned.

TECHNICAL FIELD OF THE INVENTION

The present invention relates in general to metal interconnects for integrated circuits, and more particularly to methods for forming interconnects by the selective deposition of tungsten and the interconnects formed thereby.

BACKGROUND OF THE INVENTION

Tungsten metallization by chemical vapor deposition (CVD) has reliability advantages over metallization using aluminum alloys, and CVD tungsten has lower resistivity and better step coverage than tungsten applied by sputtering. CVD tungsten is however generally difficult to etch with good selectivity to layers of resist and oxide. Further, the thick CVD tungsten lines required to achieve low sheet resistance are difficult to planarize with deposited oxide following CVD tungsten patterning and etching.

Recently, a planar multilevel tungsten interconnect technology has been developed in the industry. Following formation of the device and gate level interconnect structures, a dielectric is applied and the surface is made planar ("planarized"). Then contact holes are defined and etched in the dielectric using conventional techniques. These are then filled, for example, using selective chemical vapor deposited (CVD) tungsten. Then more dielectric is deposited, to a thickness equal to the desired metal thickness. The dielectric is coated with $Si_3N_4$ ("nitride"), and grooves are lithographically defined where metal interconnect lines are desired. The nitride is then etched, as well as the dielectric which was deposited over the contacts that had been filled with metal. The wafer is then implanted with silicon using an ion acceleration, using the nitride as a mask. The nitride is then removed chemically, leaving grooves where the metal is to be deposited, and heavy silicon dosage only at the bottom of the grooves.

Selective CVD tungsten is then deposited, the deposition occurring only in the grooves where the heavy silicon concentration is present. Thus the grooves are filled with tungsten to a thickness equal to the depth of the groove. This technique eliminates the problem of tungsten etching, and leaves filled the spaces between tungsten metal lines.

The following problems exist with this conventional process. A silicon implantation step of sufficient dosage to support selective CVD tungsten deposition is relatively expensive to perform. The adhesion of tungsten to, for instance, silicon-implanted oxide, is not expected to be good. In addition, the etching of the grooves in the dielectric must be performed without endpoint, leaving open the possibility of etching grooves into underlying circuitry. Finally, the nucleation preference of silicon over the surrounding oxide is not optimum.

From the above, it can be seen that a need has arisen in the industry for an improved planarized selective tungsten metallization system.

SUMMARY OF THE INVENTION

According to one aspect of the invention, an integrated circuit comprises a base structure and a first thick dielectric layer formed on the base structure. A plurality of contact holes are formed at preselected locations through the first dielectric layer to the base structure. A thin nucleation layer, selected such that a preselected metal will preferentially nucleate thereon, is formed on the outer surface of the first dielectric layer, and further on the sidewalls and bottom of the contact holes. This layer is defined lithographically with the desired lead pattern for the next metallization level, and etched, either using wet or dry etching techniques. A second thick dielectric layer is formed over the first dielectric layer and the nucleation layer. Then, grooves are formed through the second dielectric layer to expose the patterned nucleation layer.

Preferably, the preselected metal comprises tungsten and the nucleation layer comprises a thin (<150 nm) layer of titanium-tungsten alloy, or a bilayer of sputtered titanium and tungsten. It is also preferred that the nucleation layer be formed on the bottom and sides of the orifice.

According to yet another aspect of the invention, the planar dielectric is formed on the base structure, and then a thin nucleation layer is deposited and patterned in a lead pattern for the next metallization lead, with the exception that the resist is removed over locations where the metallization layer should make contact to the underlying base material. In other words, this patterning step uses a single lithographic mask level which leaves resist on the metallization lines but removes it from the lines where contacts are to be cut through the dielectric underneath. The metal is etched, and the resist is removed. Then a dielectric layer is applied to the surface at a thickness equal to the desired thickness of selective tungsten metallization to be used. Grooves are then patterned and etched over the thin metallization lines into which the selective tungsten is to be deposited. The grooves are lithographically defined in such a way that all of the dielectric above the metal is exposed to the subsequently-performed etch, as well as the dielectric above contact holes defined in the thin metal, mentioned above. Then an anisotropic dielectric etch is performed which creates grooves where the metallization lines will be, and which clean the underlying metal. An etchant is used which etches dielectric at an extremely high rate in comparison with the thin metal. This etch reaches an endpoint upon hitting the thin metal layer. The etch is then continued on a timed basis until the contact holes between the metallization layer being formed and the base material are etched. This aspect of the invention therefore involves one less lithographic patterning step than the first aspect adduced herein.

The sidewalls of the contacts under the thin nucleating metal layer may be coated with metal in order to improve the selective deposition process. This is to be accomplished by sputter depositing very thin metal and coating it with a planarizing film such as photoresist. This film can then be removed in such a way as to expose only the top of the metal-coated dielectric film and the sidewalls of the grooves over the thin metal layer first defined. This removal can be accomplished by means of an oxygen plasma in the case of a photoresist film. The metal so exposed is removed in a wet etchant, such as $H_2O_2$. The remaining planarizing film used to protect the metal at the bottom of the grooves and in the contacts, is removed such as by means of an oxygen plasma. This leaves a groove which is coated with metal only at the bottom, with contact holes protruding downwardly from the groove bottom. The contact holes have sidewalls and bottom coated with metal.

This structure is then subjected to selective CVD tungsten deposition in order to fill the grooves and the contacts, forming a fully planar metallization system.

The use of the planarized selective tungsten metallization system of this invention provides several advantages. First, a silicon implantation step is replaced by a cheaper thin nucleation layer deposition and definition. Since the nucleation layer preferably comprises a metal such as titanium tungsten alloy, an end point to the etch of the dielectric layer can be performed.

In conventional processes, it is difficult to control the line width of CVD tungsten, and overetching the tungsten causes a serious roughening of the multi-level oxide. In the present invention, it is not necessary to etch the thick CVD tungsten layers, as is also the case in the recent interconnect technology already described. By conventional processes, it is also difficult to deposit CVD oxide in such a way that voids are not formed between the metal lines, causing step coverage problems in the next metal level. The method of the present invention provides a further advantage in that the oxide is deposited before the thick metal is deposited, greatly reducing oxide step coverage and voiding problems.

Furthermore, in conventional processes, CVD oxide is deposited over the metal leads and subsequently planarized by the etch back of a smooth spin-on coating such as photoresist or spin-on glass. This provides short range planarization only. The present invention produces true, global planarization because no spin-on sacrificial layer is required. Instead grooves are etched and refilled with metal keeping the surface planar at all steps.

BRIEF DESCRIPTION OF THE DRAWINGS

Other aspects of the invention and their advantages will be discerned with reference to the following Detailed Description in conjunction with the appended drawings, in which:

FIGS. 2a–2c are isometric views corresponding to FIGS. 1a–1c, showing successive steps in a second embodiment of a metallization process according to the invention;

DETAILED DESCRIPTION

Figure 1A:
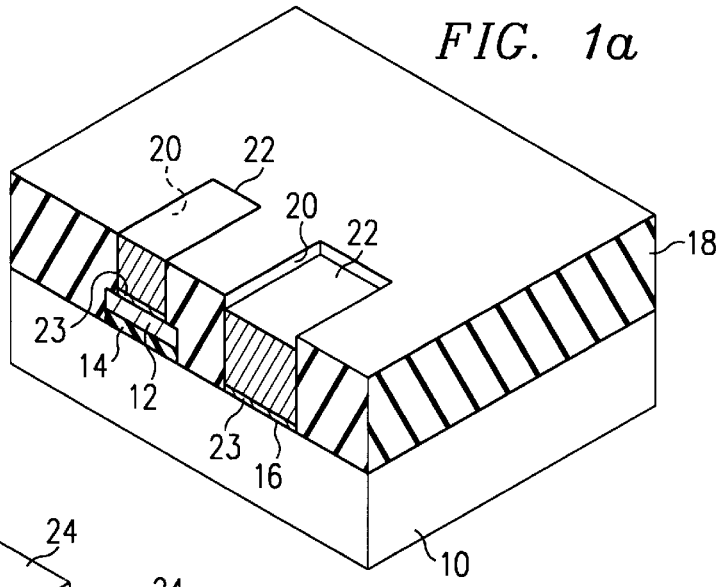
FIGS. 1a–1c are schematic isometric views of a small section of an exemplary integrated circuit, showing successive steps in a first embodiment of a metallization process according to the invention.
Figure 1B:
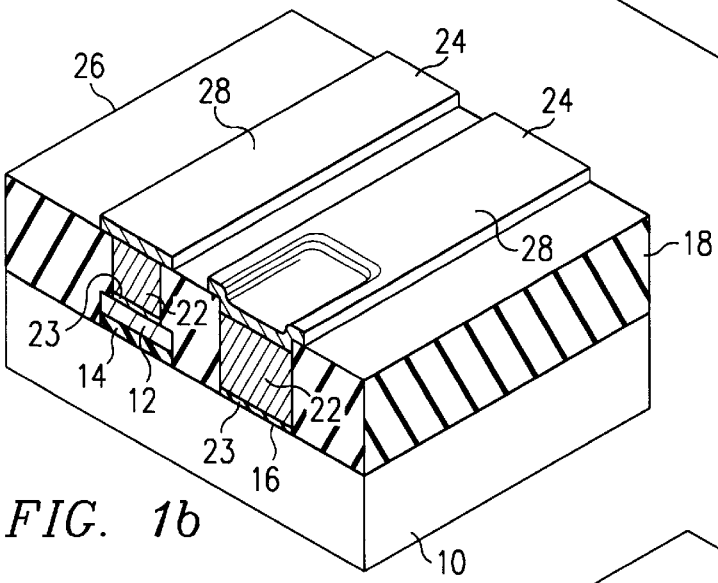
Figure 1C:
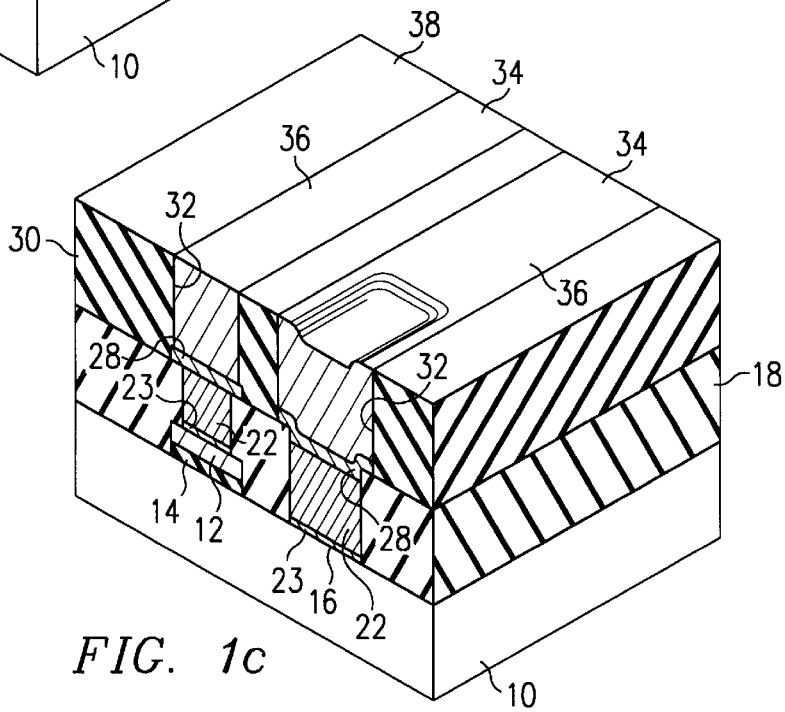

A first embodiment of the process according to the invention is shown in FIGS. 1a–1c, which are successive isometric views showing steps in the fabrication of an exemplary integrated circuit. Referring first to FIG. 1a, a base layer 10 is first provided. Base layer 10 can be a silicon semiconductor substrate as shown, but it can also be a more complex structure. Layer 10 may for example be a partially formed integrated circuit structure having one or more structures fabricated out of polycrystalline silicon, such as a polysilicon emitter contact.

In the exemplary embodiment, a gate 12, as can be formed of polysilicon, has already been fabricated to be insulatively disposed over layer 10 by a gate oxide layer 14. FIGS. 1a–1c are an exemplary demonstration of how a first level of contact and interconnect metallization is made according to the invention to gate 12 and also to an area 16 of the substrate layer 10. While only two first-level contacts to layer 10 and gate 12 are shown, it should be understood that in actual practice a multitude of first-level contacts will be formed to a very large number of integrated circuit devices that have been previously fabricated in or on layer 10.

A first, thick dielectric layer 18 is formed over layer 10. Layer 18 may alternatively constitute multiple layers (not shown) of silicon dioxide and/or other dielectric materials. Layer 18 is deposited and then planarized by the deposition and etchback of a sacrificial planarizing spin-on coating (not shown). Layer 18 may further include a top layer of borophosphosilicate glass (BPSG, not shown).

After the deposition and planarization of multilevel oxide layer 18, a plurality of contact holes 20 are patterned and etched down to layer 10 or gate 12. The photoresist (not shown) is then stripped and the contact holes 20 are refilled with tungsten plugs 22 using selective CVD tungsten deposition. A layer 23 of platinum silicide may first be deposited, patterned and etched inside contact holes 20, with the plugs 22 thereafter selectively nucleating on the platinum silicide layers 23. The tungsten will selectively nucleate on the polysilicon gate 12 or substrate area 16 (or, where employed, PtSi layers 23) as opposed to multilevel oxide layer 18. The difference in the height between the two plugs 22 occurs because of the thickness of gate 12 and gate oxide layer 14. This completes the contact metallization in this embodiment.

Turning now to FIG. 1b, a very thin, preferably metallic nucleation layer 24 is next deposited over an outer surface 26 of layer 18, and also over plugs 22. Layer 24 is then patterned and etched in a second metallization pattern to form individual nucleation layers 28. As will be shown, nucleation layers 28 each are formed the bottom of respective orifice or slot. Each nucleation layer 28 is shown to, but does not necessarily need to, extend laterally completely around the upper perimeter of each plug 22 to which layer 28 connects. Any number of metals can be used to fabricate nucleation layers 28, including titanium, sputtered tungsten, chromium, any of the other transition metals, aluminum, or silicon. A preferred material is titanium-tungsten alloy, since this yields superior adhesion and high temperature stability characteristics. Another preferred material is a bilayer of sputtered titanium and tungsten.

Turning now to FIG. 1c, the remaining steps in fabricating an interconnect according to the first embodiment of the invention are shown. A thick multilevel second dielectric layer 30, such as phosphosilicate glass (PSG), is patterned in a reverse interconnect metallization pattern (not shown) so as to define orifices or slots 32 that each correspond to a nucleation layer 28. The second dielectric layer 30 is then etched back down to nucleation layers 28 to create orifices or slots 32.

A layer of photoresist (not shown) that was used to pattern and etch holes 32 is then removed by ashing or by solvent cleanup. Then, tungsten is deposited by selective chemical vapor deposition in orifices or slots 32 to form metal interconnect conductors 34. The CVD tungsten deposition step is carried on until the top or outer surface 36 of interconnect conductors 34 is at least substantially coplanar with the top or outer surface 38 of PSG layer 30. The surfaces 36 and 38 may be fairly rough, and the FIGURES are in this respect quite schematic. By the use of "substantially coplanar" it is meant that the smoothed averages of surfaces 36 and 38 lie in as nearly the same plane as is practicable. The substantially planarized surface formed by surfaces 36 and 38 may then have a layer of oxide (not shown) deposited on it to complete the structure. The process can then be repeated to form additional metallization layers starting with via patterning and etching.

A second and particularly preferred embodiment of the process according to the invention is shown in FIGS. 2a through 2c, which illustrate successive steps in fabricating a greatly simplified and exemplary integrated circuit structure like that shown in FIGS. 1a–1c. Throughout FIGS. 1a–1c, 2a–2c, 3a–3d and 4a–4d, like numbers identify like parts where possible.

As before, a first dielectric layer 18 is deposited over a base structure 10, a gate 12 and a gate oxide layer 14. Layer 18 is planarized as described for FIG. 1a. Preferably, a nitride layer 50 is then deposited as the last dielectric layer of multilevel dielectric layer 18. Contact holes 20 are patterned and etched through the dielectric layers 18 and 50. A nucleating conductors 52 are then deposited, patterned and etched to conform to an interconnect metallization pattern, and further to coat the interior of contact holes 20. Nucleating conductors 52 can be formed of any of the materials given for nucleation layers 28 (FIG. 1b), but are preferably fabricated of titanium-tungsten alloy (Ti-W). The Ti-W nucleating conductors 52 cover both the sidewalls 53 of contact holes 20 and the bottom 55 thereof. Nucleating conductors 52 also cover a surface 56 of nitride layer 50 in the areas immediately adjoining contact holes 20, as well as in those other areas of surface 56 that will be the bottom of the orifices or slots (58; see FIG. 2b) for the interconnect conductors. The overlap of the contact edges by the thin nucleating conductors 52 is not required, however.

Turning now to FIG. 2b, a second, preferably phosphosilicate glass (PSG) dielectric layer 30 is deposited on nitride layer 50 and on nucleating conductors 52. Before the etch, dielectric layer 30 will fill orifices 54 inside contact holes 20. Dielectric layer 30 is then patterned using a reverse interconnect metallization pattern (not shown).

An etch of dielectric layer 30 is performed that uses a reverse interconnect metallization pattern to etch through layer 30 to the nucleation conductors 52 and adjacent areas of surface 56 of nitride layer 50. The interposition of hard mask layer 50 prevents caving on either side of each nucleating conductor 52 during an isotropic (wet) contact clearing and groove widening etch after the grooves are cut. Nitride layer 50 is also used as an etch stop for an isotropic (wet) contact clearing etch once the grooves are first cut. A small, intentional overetch is performed in this embodiment of layer 30 in order to assure the removal of all dielectric material out of contact holes 54. The etch creates a plurality of slots or orifices 58 into which the tungsten will be selectively deposited.

Turning now to FIG. 2c, tungsten is deposited by chemical vapor deposition into orifices 54 and slots 58, preferentially nucleating on Ti-W conductors 52. The CVD continues until integral contact and interconnect tungsten conductors 60 have been accumulated with outer surfaces 62 that are substantially coplanar with the outer surface 38 of second dielectric layer 30. This planarized surface is then ready for further levels of metallization or for an oxide passivation layer.

The above-described second embodiment is particularly advantageous in that it produces a plurality of integral combination contact and interconnect conductive leads 60. The number of interfaces between the second level metal and the first level device contacts are minimized, and this in turn reduces metallization resistance.

Figure 3C:
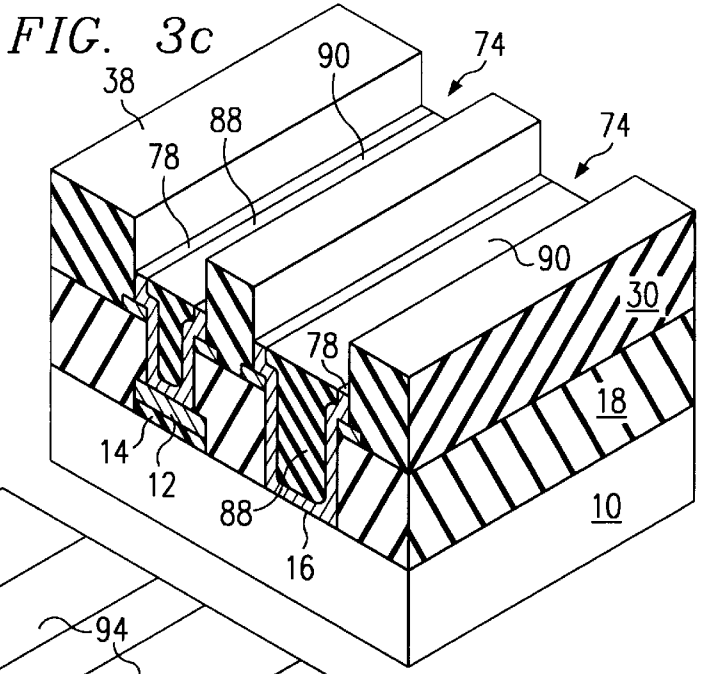
FIGS. 3a–3d are isometric views corresponding to FIGS. 1a–1c or 2a–2c, showing successive steps in a third embodiment of a metallization process according to the invention.
Figure 3D:
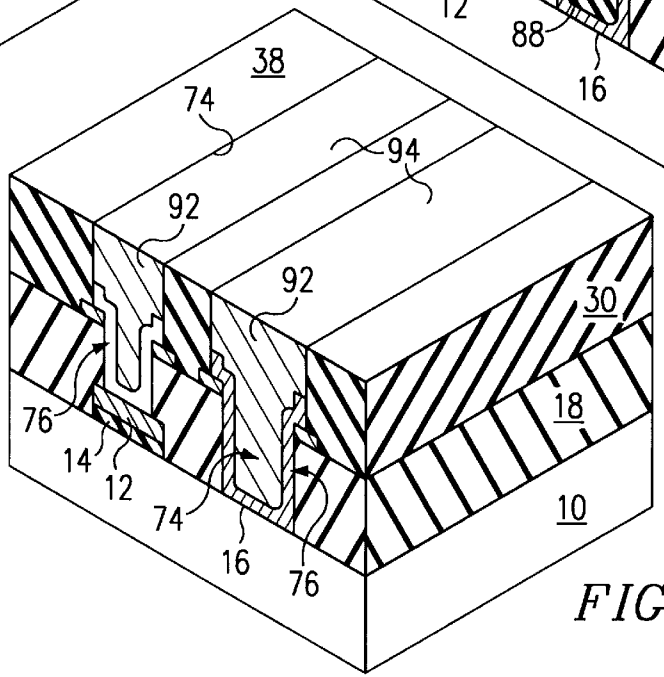
Figure 3A:
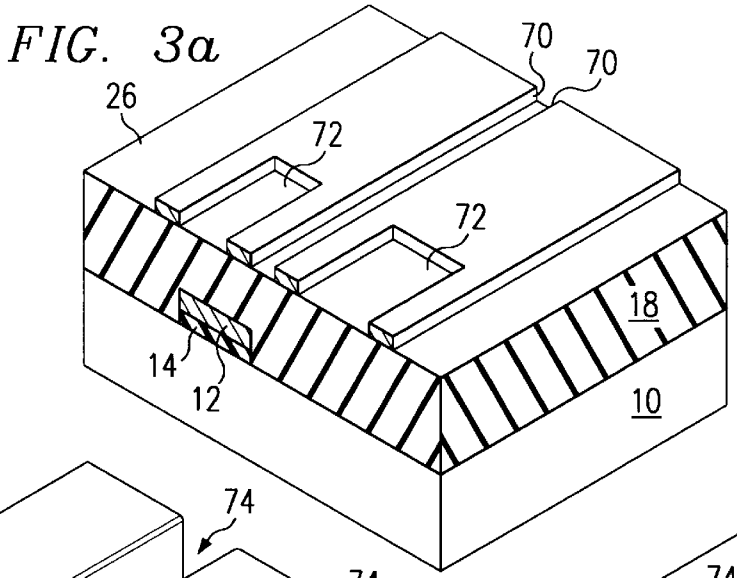

FIGS. 3a–3d illustrate a third embodiment of the invention where it is desired to save a masking step. As shown in FIG. 3a, a substrate or integrated circuit layer 10 is once again provided having a polysilicon gate 12 and an oxide layer 14 deposited thereon. As before, a first dielectric layer 18 is deposited over substrate 10, polysilicon gate layer 12 and oxide layer 14.

First nucleation layers 70 are then deposited on surface 26 of first dielectric layer 18, patterned in what is principally an interconnect metallization pattern, and etched. In addition, wherever a contact between the base structure and the interconnect metal is desired to be made, each first nucleation layer 70 will be patterned and etched to have defined therethrough an orifice 72 that will be used to self-align a subsequent etch step for forming a respective contact hole.

Figure 3B:
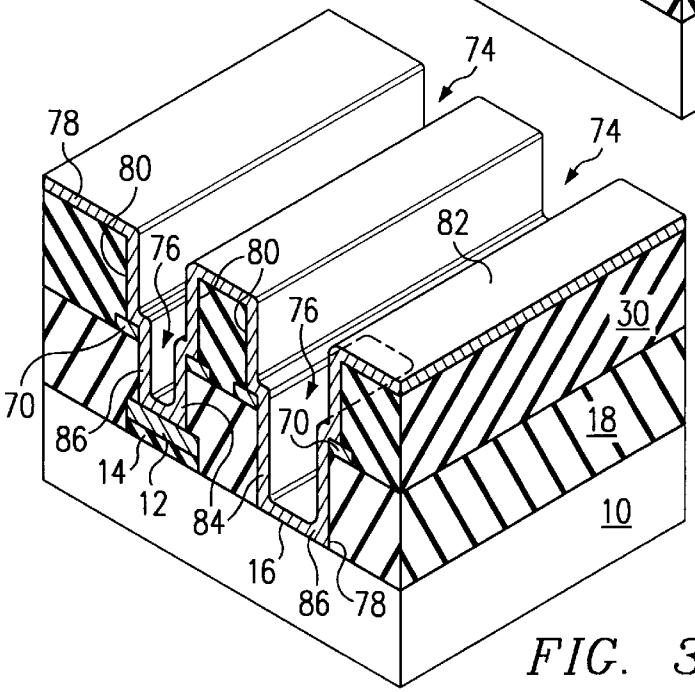

Turning now to FIG. 3b, a second thick dielectric layer 30 is next deposited over first nucleation layers 70 and first dielectric layer 18. Dielectric layer 30 is then patterned with a reverse interconnect metallization pattern (not shown) that is somewhat smaller in its lateral dimensions that nucleation layers 70. This reverse metallization pattern, however, omits a reverse mask for orifices 72 (FIG. 3a). When the etchant is applied, slots or orifices 74 will be formed in second dielectric layer 30 down to nucleation layers 70. Within orifices 72 (FIG. 3a) the etch will continue downward past first nucleation layers 70 through first dielectric layer 18 to create a respective plurality of contact holes 76.

For the selective CVD tungsten step, a nucleation layer should be formed in the bottoms of orifices 76. If this formation is omitted, it is possible that lateral selective tungsten growth from the edges of metal 70 would pinch off the top of the contact holes 76 before a continuous conductor can be formed in the contact holes 76. Therefore, a second nucleation layer 78 is preferably deposited over the outer surface of dielectric layer 30 and to coat the sidewalls 80 of slots 74, the bottoms 82 (indicated in phantom) of slots 74, the sidewalls 84 of contact holes 76, and the bottoms 86 of contact holes 76. This second nucleation layer 78 is preferably made of the same materials as first nucleation layer 70.

Referring next to FIG. 3c, a resist layer 88 is deposited over nucleation layer 78. Resist layer 88 is ashed back to surface 90 in each slot 74 that is slightly above the bottom surface of slots 74. An etch of nucleation layer 78 is then performed to remove those areas of second nucleation layer 78 above the surfaces 90 of remaining resist portions 88. The remaining portions of nucleation layer 78 will be entirely within slots 74 and contact holes 76. The remaining resist portions 88 are then removed.

Referring next to FIG. 3d, the structure is ready for the selective deposition of combination contact and interconnect tungsten conductors 92. As in the preferred embodiment shown in FIGS. 2a–2d, conductors 92 form integral contact and interconnect metallization since the tungsten extends down from any slot 74 into all contact holes 76 connected thereto. Tungsten conductors 92 are selectively deposited until their outer surfaces 94 are substantially coplanar with the outer surface 38 of second dielectric layer 30.

A fourth embodiment is shown in FIGS. 4a–4d, which are sectional views of sequential fabrication steps like those shown in the other FIGURES.

In a fourth embodiment according to the invention, alternate dielectric materials are used in a way that makes self-aligned contacts with an extra interposed thin dielectric film instead of with an extra interposed thin metal film. In this approach, three or more alternating layers of two dielectric materials that can be etched with selectively to each other are deposited on top of the base structure.

Figure 4A:
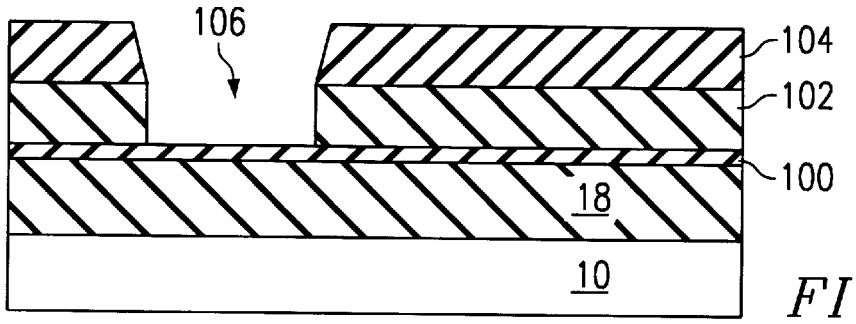
FIGS. 4a–4d are schematic sectional views of steps in a fabrication process according to a fourth embodiment of the invention.

FIGS. 4a–4d are schematic, highly magnified sectional views illustrating an exemplary process according to this fourth embodiment. Referring first to FIG. 4a, a dielectric stack comprising a first, thick silicon dioxide layer 18, an alumina layer 100, and a second, thick silicon dioxide layer 102 are sequentially deposited on a base structure 10. In the illustrated embodiment, the layers 18 and 102 are approximately 1.0 microns in thickness, while alumina layer 100 is approximately 0.2 microns thick.

A resist layer 104 is next deposited on $SiO_2$ layer 102 and is patterned with a contact pattern to create an orifice 106. $SiO_2$ layer 102 is then etched within orifice 106 with selectivity to underlying $Al_2O_3$ layer 100. Resist layer 104 is then stripped.

Figure 4B:
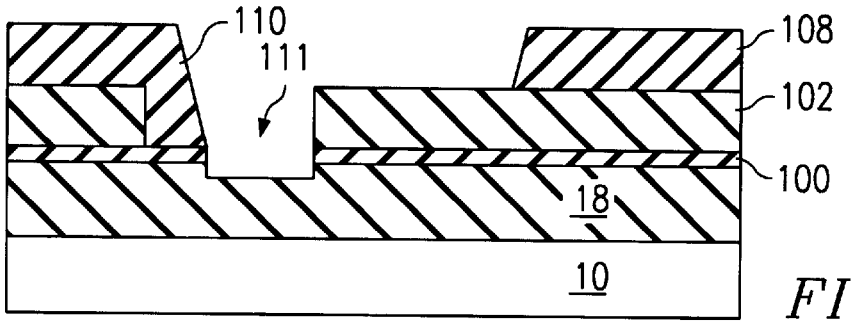

Referring next to FIG. 4b, a second resist layer 108 is deposited on layer 102 and within orifice 106. Resist layer 108 is then patterned with an inverse interconnect pattern. FIG. 4b illustrates the case where there is a misalignment between the contact pattern and the interconnect pattern, such that a portion 110 of resist layer 108 is left within contact orifice 106. This misalignment results in a smaller contact orifice 111. That portion of $Al_2O_3$ layer 100 that is exposed both by orifice 106 and the interconnect-patterned resist layer 108 (orifice 111) is etched with selectivity to the underlying oxide 18 as well as oxide layer 102.

Figure 4C:
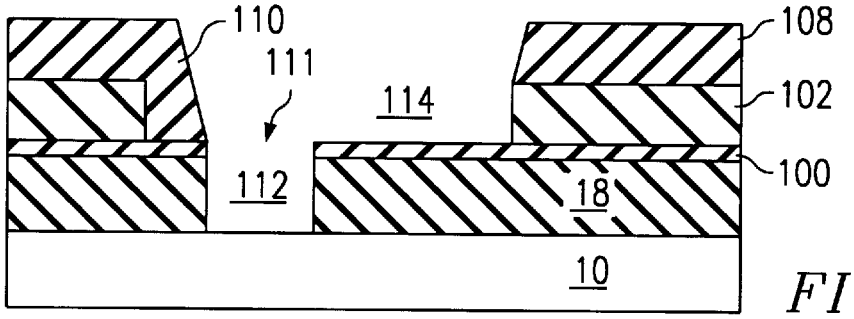

Referring next to FIG. 4c, the same interconnect-patterned resist layer 106 is used in an etch of $SiO_2$ layer 102 with selectivity to $Al_2O_3$ layer 100. At the same time that the exposed areas of oxide layer 102 are etched, the exposed areas of first oxide layer 18 is etched within orifice 111 to create a contact hole 112. The etch of exposed areas of second oxide layer 102 creates a slot 114 for the interconnect metal. The interconnect-patterned resist layer 108 is then stripped.

Figure 4D:
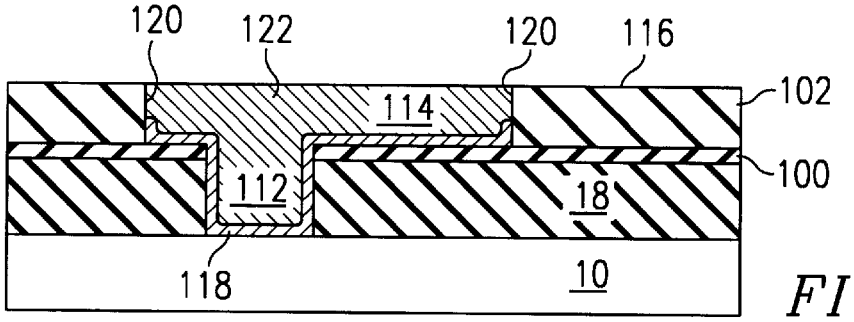

Referring finally to FIG. 4d, contact hole 112 and slot 114 are filled to a top surface 116 of layer 102 by the selective deposition of tungsten. One method of accomplishing this is to form a layer 118 of Ti-W alloy on the bottoms and sidewalls of contact hole 112 and slot 114. Layer 118 would then be etched back so that only a small portion of sidewalls 120 of slot 114 would be covered, per the technique described for FIGS. 3a–3d. Layer 118 would then be used as a nucleation layer for the selective chemical vapor deposition of tungsten to form integral interconnect structure 122.

If necessary, the resist layer used to etch back layer 118 could be patterned with a relatively uncritical pattern to assure that the nucleation metal 118 remains in the bottom of large interconnect features.

In an alternative embodiment (not shown), one to three additional thin alternating layers of $Al_2O_3$ and $SiO_2$, or other dielectrics with similar selective etch properties with respect to each other, can be added in a similar sequence to avoid patterning the interconnect pattern over a deep etch contact hole. In this last alternative, the pattern would be transferred from the resist into thinner, top layers of $Al_2O_3$ and $SiO_2$. The pattern would then be transferred from these thin layers to thicker layers of $SiO_2$ in subsequent etch steps. Further, the order of etching contacts or interconnects can be exchanged in some schemes with more than three alternating layers of $SiO_2$ and $Al_2O_3$.

While the invention has been particularly described as employing CVD tungsten it has application to any metal that can be selectively deposited by CVD on a conductive nucleation layer.

In summary, an improved selective metallization system has been shown and described. The system uses a nucleation layer, preferably a single layer as formed in the orifices of contact holes and extending over the bottoms of interconnect orifices or slots, with a metal such as tungsten being selectively deposited on the nucleation layer thereafter. The present invention provides technical advantages in that it results in a planarized upper surface of the second dielectric layer, avoids the forming of voids in the dielectric layers, and provides a nucleation layer having low resistance and a high quality of adhesion.

While illustrated embodiments of the present invention have been described in the above Detailed Description, the invention is not limited thereto but only by the spirit and scope of the appended claims.

What is claimed is:

1. A process for forming a conductive interconnection in an integrated circuit structure, comprising the steps of:

providing a partially formed integrated circuit having a substrate structure;

forming a first [thick] insulating layer on said substrate; forming at least one contact hole through said insulating layer*, exposing a portion of said substrate*;

depositing a [thin] nucleation layer on said first insulating layer*, wherein said nucleation layer is formed at least on the outer surface of said first insulating layer, the sidewalls of said contact hole and on the exposed portion of said substrate, while leaving at least a portion of said contact hole voided*;

patterning said [thin] nucleation layer;

forming a second [thick] insulating layer on said first insulating layer and said patterned [thin] nucleation layer;

forming an opening in said second insulating layer to expose said patterned [thin] nucleation layer; and selectively depositing a conductor in said opening, said patterned [thin] nucleation layer serving as a nucleation site for said selective deposition.

2. The process of claim 1 wherein said opening in said second insulating layer is formed by etching said second insulating layer, said [thin] nucleation layer serving as an etch stop for said etching.

[3. The process of claim 1 further comprising the step of filling said contact hole with a conductive material prior to said depositing of said thin nucleation layer.]

[4. The process of claim 3 wherein said step of filling said contact hole comprises the steps of:

forming a contact nucleation layer of said substrate at the bottom of said contact hole; and selectively depositing a conductive material in said contact hole using said contact nucleation layer as a nucleation site.]

5. The process of claim [3] *1,* wherein said [thin nucleation layer covers the walls of said contact hole and covers the exposed portion of said substrate, said] selective deposition fill[ing]*s* said contact hole.

6. The process of claim 1 wherein said [thin] nucleation layer comprises a Titanium-Tungsten alloy and said conductor comprises Tungsten.

7. A process for forming a conductive interconnection in an integrated circuit structure, comprising the steps of:

providing a partially formed integrated circuit having a substrate structure;

forming a first [thick] insulating layer on said substrate; depositing a [thin] nucleation layer on said first insulating layer;

patterning said [thin] nucleation layer, said patterned nucleation layer having a contact opening exposing said first [thick] insulating layer for formation of a contact hole;

forming a second [thick] insulating layer on said first insulating layer and said patterned [thin] nucleation layer;

forming an etch mask [for patterning] *on* said second insulating layer;

etching said second insulator layer using said etch mask to provide an opening in said second [thick] insulating layer, said opening exposing *at least* said *contact opening in said* patterned [thin] nucleation layer;

forming said contact hole in said first insulating layer using said [thin] nucleation layer and said etch mask [to] as a pattern for etching said first insulating layer;

*forming a second nucleation layer on said nucleation layer and in said contact hole;* selectively depositing a conductor in said opening, said patterned [thin] nucleation layer serving as a nucleation site for said selective deposition.

8. The process of claim 7 wherein said opening in said second insulating layer is formed by etching said second insulating layer, said [thin] nucleation layer serving as an etch stop for said etching.

9. The process of claim 7 wherein said [thin] nucleation layer comprises a Titanium-Tungsten alloy and said conductor comprises Tungsten.

10. A process for forming a conductive interconnection in an integrated circuit structure, comprising the steps of:

providing a partially formed integrated circuit having a substrate structure;

forming a first [thick] insulating layer on said substrate; depositing a etch stop layer on said first insulating layer;

patterning said etch stop layer, said patterned etch stop layer having a contact opening exposing said first [thick] insulating layer for formation of a contact hole;

forming a second [thick] insulating layer on said first insulating layer and said etch stop layer;

forming an etch mask [for patterning] *on* said second insulating layer;

etching said second insulating layer using said etch mask to provide an opening in said second [thick] insulating layer, said opening exposing *at least* said *contact opening in said patterned* etch stop layer;

forming said [contact] hole in said first insulating layer using said etch stop layer and said etch mask [to] as a pattern for etching said first insulating layer;

forming a [thin] nucleation layer on said etch stop layer and in said contact hole; and selectively depositing a conductor in said opening, said patterned [thin] nucleation layer serving as a nucleation site for said selective deposition.

11. The process of claim 10 wherein said opening in said second insulating layer is formed by etching said second insulating layer, said etch stop layer serving as an etch stop for said etching.

12. The process of claim 10 wherein said [thin] nucleation layer comprises a Titanium-Tungsten alloy and said conductor comprises Tungsten.

*13. The process of claim 1, wherein said nucleation layer comprises a bilayer.*

*14. The process of claim 1, wherein said nucleation layer is sufficiently thin to assist in maintaining a substantially planarized upper surface of said second insulating layer.*

*15. The process of claim 1, wherein said second insulating layer is sufficiently thick to assist in maintaining a substantially planarized upper surface of said second insulating layer.*

*16. The process of claim 1, wherein said second insulating layer is sufficiently thick and said nucleation layer is sufficiently thin to assist in maintaining a substantially planarized upper surface of said second thick insulating layer.*

*17. The process of claim 1, and further comprising the step of depositing a second nucleation layer on said nucleation layer after said step of forming an opening, such that said second nucleation layer serves as a nucleation site for said selective deposition.*

*18. The process of claim 17, wherein said nucleation layer serves as an etch stop for said step of forming an opening.*

*19. A process for forming a conductive interconnection in an integrated circuit structure, comprising the steps of:*

*forming a first insulating layer on a substrate;*

*depositing a nucleation layer on said first insulating layer;*

*patterning said nucleation layer, said patterned nucleation layer having a contact opening exposing said first insulating layer;*

*forming a second insulating layer on said first insulating layer and said patterned nucleation layer;*

*forming an opening in said second insulating layer to expose at least said contact opening in said patterned nucleation layer;*

*forming a hole in said first insulating layer using said nucleation layer and said second insulating layer as a pattern for etching said first insulating layer;*

*depositing a second nucleation layer on said nucleation layer and in said hole after said step of forming an opening; and*

*selectively depositing a conductor in said opening, said second nucleation layer serving as a nucleation site for said selective deposition.*

*20. A process for forming a conductive interconnection in an integrated circuit structure, comprising the steps of:*

*forming a first insulating layer on a substrate;*

*depositing an etch stop layer on said first insulating layer;*

*patterning said etch stop layer, said patterned etch stop layer having a contact opening exposing said first insulating layer;*

*forming a second insulating layer on said first insulating layer and said patterned etch stop layer;*

*forming an opening in said second insulating layer to expose at least said contact opening in said patterned etch stop layer;*

*forming a hole in said first insulating layer using said etch stop layer and said second insulating layer as a pattern for etching said first insulating layer;*

*depositing a nucleation layer on said etch stop layer after said step of forming an opening; and*

*selectively depositing a conductor in said opening, said nucleation layer serving as a nucleation site for said selective deposition.*

*21. A process for forming a conductive interconnection in an integrated circuit structure, comprising the steps of:*

*providing a partially formed integrated circuit having a substrate structure;*

*forming a first insulating layer above said substrate;*

*forming at least one contact hole through said insulating layer, wherein said contact hole has sidewalls and exposes a portion of said substrate;*

*depositing a nucleation layer above said first insulating layer, wherein said nucleation layer is formed at least on the outer surface of said first insulating layer, on the sidewalls of said contact hole and on the exposed portion of said substrate, while leaving at least a portion of said contact hole voided;*

*patterning said nucleation layer;*

*forming a second insulating layer above said first insulating layer and said patterned nucleation layer;*

*forming an opening in said second insulating layer to expose said patterned nucleation layer; and*

*selectively depositing a conductor in said opening, said nucleation layer serving as a nucleation site for said selective deposition.*

*22. A process for forming a conductive interconnection in an integrated circuit structure, comprising the steps of:*

*providing a partially formed integrated circuit having a substrate structure;*

*forming a first insulating layer on said substrate;*

*forming at least one contact hole through said insulating layer, wherein said contact hole has sidewalls and exposes a portion of said substrate;*

*depositing a nucleation layer on said first insulating layer, wherein said nucleation layer is formed at least on the outer surface of said first insulating layer, on the sidewalls of said contact hole and on the exposed portion of said substrate, while leaving at least a portion of said contact hole voided;*

*patterning said nucleation layer;*

*forming a second insulating layer above said first insulating layer and said patterned nucleation layer;*

*forming an opening in said second insulating layer to expose said patterned nucleation layer; and*

*selectively depositing a conductor in said opening, said nucleation layer serving as a nucleation site for said selective deposition.*

*23. The process of claim 22, wherein said nucleation layer is sufficiently thin to assist in maintaining a substantially planarized upper surface of said second insulating layer.*

*24. The process of claim 22, wherein said second insulating layer is sufficiently thick to assist in maintaining a substantially planarized upper surface of said second insulating layer.*

*25. The process of claim 22, wherein said second insulating layer is sufficiently thick and said nucleation layer is sufficiently thin to assist in maintaining a substantially planarized upper surface of said second insulating layer.*

*26. A process for forming a conductive interconnection in an integrated circuit structure comprising the steps of:*

*providing a partially formed integrated circuit having a substrate structure;*

*forming a first insulating layer above a substrate;*

*forming at least one contact hole through said insulating layer, wherein said contact hole has sidewalls and exposes a portion of said substrate;*

*depositing a nucleation layer above said first insulating layer, wherein said nucleation layer is formed at least on the outer surface of said first insulating layer, on the sidewalls of said contact hole and on the exposed portion of said substrate, while leaving at least a portion of said contact hole voided;*

*patterning said nucleation layer;*

*forming a second insulating layer above said first insulating layer and said patterned nucleation layer; and*

*forming an opening in said second insulating layer to expose said patterned nucleation layer; and*

*selectively depositing a conductor in said opening, said patterned nucleation layer serving as a nucleation site for said selective deposition.*

*27. A process for forming a conductive interconnection in an integrated circuit structure comprising the steps of:*

*forming a first insulating layer above a substrate;*

*depositing a nucleation layer above said first insulating layer;* i patterning said nucleation layer, said patterned nucleation layer having a contact opening exposing said first insulating layer;

*forming a second insulating layer above said first insulating layer and said patterned nucleation layer; and*

*forming an opening in said second insulating layer to expose at least said contact opening in said patterned nucleation layer;* i forming a hole in said first insulating layer using said patterned nucleation layer and said second insulating layer as a pattern for etching said first insulating layer;

*depositing a nucleation layer on said patterned nucleation layer and in said hole and after said step of forming an opening; and*

*selectively depositing a conductor in said opening, said patterned nucleation layer serving as a nucleation site for said selective deposition.*

*28. A process for forming a conductive interconnection in an integrated circuit structure, comprising the steps of:*

*providing a partially formed integrated circuit having a substrate structure;*

*forming a first insulating layer on said substrate;*

*forming at least one contact hole through said insulating layer, wherein said contact hole has sidewalls and exposes a portion of said substrate;*

*depositing a first nucleation layer on said first insulating layer, wherein said nucleation layer is formed at least on the outer surface of said first insulting layer, on the sidewalls of said contact hole and on the exposed portion of said substrate, while leaving at least a portion of said connection hole voided;*

*patterning said first nucleation layer;*

*forming a second insulating layer on said first insulating layer and said patterned first nucleation layer;*

*forming an opening in said second insulating layer to expose said patterned first nucleation layer;*

*depositing a second nucleation layer on said first nucleation layer after said step of forming an opening; and*

*selectively depositing a conductor in said opening, said second nucleation layer serving as a nucleation site for said selective deposition.*

* * * * *